United States Patent
Sagawa (10) Patent No.: US 11,545,337 B2
(45) Date of Patent: Jan. 3, 2023

(54) SCANNING TRANSMISSION ELECTRON MICROSCOPE AND ADJUSTMENT METHOD OF OPTICAL SYSTEM

(71) Applicant: JEOL Ltd., Tokyo (JP)

(72) Inventor: Ryusuke Sagawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 2 days.

(21) Appl. No.: 17/236,074

(22) Filed: Apr. 21, 2021

(65) Prior Publication Data
US 2021/0335570 A1    Oct. 28, 2021

(30) Foreign Application Priority Data

Apr. 23, 2020  (JP) .............................. JP2020-076579
Feb. 12, 2021  (JP) .............................. JP2021-020734

(51) Int. Cl.
| | |
|---|---|
| *H01J 37/256* | (2006.01) |
| *H01J 37/26* | (2006.01) |
| *H01J 37/28* | (2006.01) |
| *H01J 37/10* | (2006.01) |
| *H01J 37/147* | (2006.01) |
| *H01J 37/22* | (2006.01) |

(52) U.S. Cl.
CPC .............. *H01J 37/28* (2013.01); *H01J 37/10* (2013.01); *H01J 37/1471* (2013.01); *H01J 37/222* (2013.01); *H01J 37/265* (2013.01); *H01J 2237/1534* (2013.01); *H01J 2237/2802* (2013.01)

(58) Field of Classification Search
CPC ........ H01J 37/10; H01J 37/147; H01J 37/153; H01J 37/22; H01J 37/222; H01J 37/265
See application file for complete search history.

(56) References Cited

U.S. PATENT DOCUMENTS

| | | | |
|---|---|---|---|
| 2013/0099117 A1* | 4/2013 | Akima .................. | H01J 37/261 250/311 |
| 2020/0294759 A1* | 9/2020 | Zhong .................. | H01J 37/295 |

FOREIGN PATENT DOCUMENTS

| | | | | |
|---|---|---|---|---|
| JP | 2008130264 A | 6/2008 | | |
| WO | WO-2015037313 A1 * | 3/2015 | ............ | H01J 37/153 |

\* cited by examiner

*Primary Examiner* — Eliza W Osenbaugh-Stewart
(74) *Attorney, Agent, or Firm* — The Webb Law Firm (57) ABSTRACT

A scanning transmission electron microscope that scans a specimen with an electron probe to acquire an image. The scanning transmission electron microscope includes: an optical system which includes a condenser lens and an objective lens; an imaging device which is arranged on a back focal plane or a plane conjugate to the back focal plane of the objective lens and which is capable of photographing a Ronchigram; and a control unit which performs adjustment of the optical system. The control unit is configured or programed to: acquire an image of a change in a Ronchigram that is attributable to a change in a relative positional relationship between the specimen and the electron probe; and determine a center of the Ronchigram based on the image of the change in the Ronchigram.

10 Claims, 6 Drawing Sheets

SCANNING TRANSMISSION ELECTRON MICROSCOPE AND ADJUSTMENT METHOD OF OPTICAL SYSTEM

CROSS-REFERENCE TO RELATED APPLICATIONS

This application claims priority to Japanese Patent Application No. 2020-076579 filed Apr. 23, 2020, and Japanese Patent Application No. 2021-020734 filed Feb. 12, 2021, the disclosures of which are hereby incorporated by reference in their entirety.

BACKGROUND OF THE INVENTION

Field of the Invention

The present invention relates to a scanning transmission electron microscope and to an adjustment method of an optical system.

Description of Related Art

A scanning transmission electron microscope (a STEM) is an apparatus for scanning a specimen with a focused electron beam (an electron probe) and detecting electrons having been transmitted through the specimen to obtain a scanning transmission electron microscope image (a STEM image).

In a scanning transmission electron microscope, a Ronchigram is used for adjustments of an optical system such as axis alignment and aberration correction. A Ronchigram is a projected image (pattern) of a specimen that is formed on a diffraction surface by focusing an electron beam near the specimen in a scanning transmission electron microscope. In a scanning transmission electron microscope, a Ronchigram is a diffraction pattern of an electron beam that is formed along an optical axis among diffraction patterns of electron beams having been transmitted through a specimen.

As a prerequisite for adjusting an optical system using a Ronchigram, a center of the Ronchigram must be determined (refer to JP-A-2008-130264). For example, in aberration calculation for aberration correction, a center of a Ronchigram is set as an axis for aberration measurement. In addition, for example, when acquiring a high resolution image, a condenser aperture is desirably arranged at a center of a Ronchigram.

As a method of determining a center of a Ronchigram, for example, a method is known in which a user visually confirms a Ronchigram and determines a center of the Ronchigram. However, visually confirming a Ronchigram and determining the center of the Ronchigram requires a certain amount of experience.

Furthermore, JP-A-2008-130264 discloses a method of determining a center of a Ronchigram by performing predetermined arithmetic processing using Ronchigram images at time points preceding and following a change in accelerating voltage to obtain a fixed point of an image.

However, with the method of determining the center of a Ronchigram disclosed in JP-A-2008-130264, since a positional displacement between the Ronchigram image preceding a change in accelerating voltage and the Ronchigram image following the change in accelerating voltage must be detected, a specimen having a characteristic shape must be prepared separately from a specimen that is an observation object.

SUMMARY OF THE INVENTION

According to a first aspect of the invention, there is provided a scanning transmission electron microscope that scans a specimen with an electron probe to acquire an image, the scanning transmission electron microscope including:

an optical system which includes a condenser lens and an objective lens;

an imaging device which is arranged on a back focal plane or a plane conjugate to the back focal plane of the objective lens and which is capable of photographing a Ronchigram; and a control unit which performs adjustment of the optical system, the control unit performing processing for:

acquiring an image of a change in a Ronchigram that is attributable to a change in a relative positional relationship between the specimen and the electron probe; and determining a center of a Ronchigram based on the image of a change in a Ronchigram.

According to a second aspect of the invention, there is provided an adjustment method of an optical system in a scanning transmission electron microscope, the scanning transmission electron microscope including: an optical system which includes a condenser lens and an objective lens; and an imaging device which is arranged on a back focal plane or a plane conjugate to the back focal plane of the objective lens and which is capable of photographing a Ronchigram, the scanning transmission electron microscope scanning a specimen with an electron probe to acquire an image, the adjustment method including:

acquiring an image of a change in a Ronchigram that is attributable to a change in a relative positional relationship between the specimen and the electron probe; and determining a center of a Ronchigram based on the image of a change in a Ronchigram.

DESCRIPTION OF THE INVENTION

According to an embodiment of the invention, there is provided a scanning transmission electron microscope that scans a specimen with an electron probe to acquire an image, the scanning transmission electron microscope including:

an optical system which includes a condenser lens and an objective lens;

an imaging device which is arranged on a back focal plane or a plane conjugate to the back focal plane of the objective lens and which is capable of photographing a Ronchigram; and a control unit which performs adjustment of the optical system, the control unit performing processing for:

acquiring an image of a change in a Ronchigram that is attributable to a change in a relative positional relationship between the specimen and the electron probe; and determining a center of a Ronchigram based on the image of a change in a Ronchigram.

In such a scanning transmission electron microscope, since a center of a Ronchigram is determined based on an image of a change in a Ronchigram that is attributable to a change in a relative positional relationship between a specimen and an electron probe, the center of a Ronchigram can be determined from an amorphous region included in a general specimen without having to prepare a specimen having a characteristic shape. Therefore, for example, the specimen need not be replaced in order to adjust the optical system.

According to an embodiment of the invention, there is provided an adjustment method of an optical system in a scanning transmission electron microscope, the scanning transmission electron microscope including: an optical system which includes a condenser lens and an objective lens; and an imaging device which is arranged on a back focal plane or a plane conjugate to the back focal plane of the objective lens and which is capable of photographing a Ronchigram, the scanning transmission electron microscope scanning a specimen with an electron probe to acquire an image, the adjustment method including:

acquiring an image of a change in a Ronchigram that is attributable to a change in a relative positional relationship between the specimen and the electron probe; and determining a center of a Ronchigram based on the image of a change in a Ronchigram.

In such an adjustment method of an optical system, since a center of a Ronchigram is determined based on an image of a change in a Ronchigram that is attributable to a change in a relative positional relationship between a specimen and an electron probe, the center of a Ronchigram can be determined from an amorphous region included in a general specimen without having to prepare a specimen having a characteristic shape. Therefore, for example, the specimen need not be replaced in order to adjust the optical system.

Preferred embodiments of the invention are described in detail below with reference to the drawings. It is noted that the following embodiments do not unduly limit the scope of the invention as stated in the claims. In addition, all of the components described in the following embodiments are not necessarily essential requirements of the invention.

1. Scanning Transmission Electron Microscope

Figure 1:
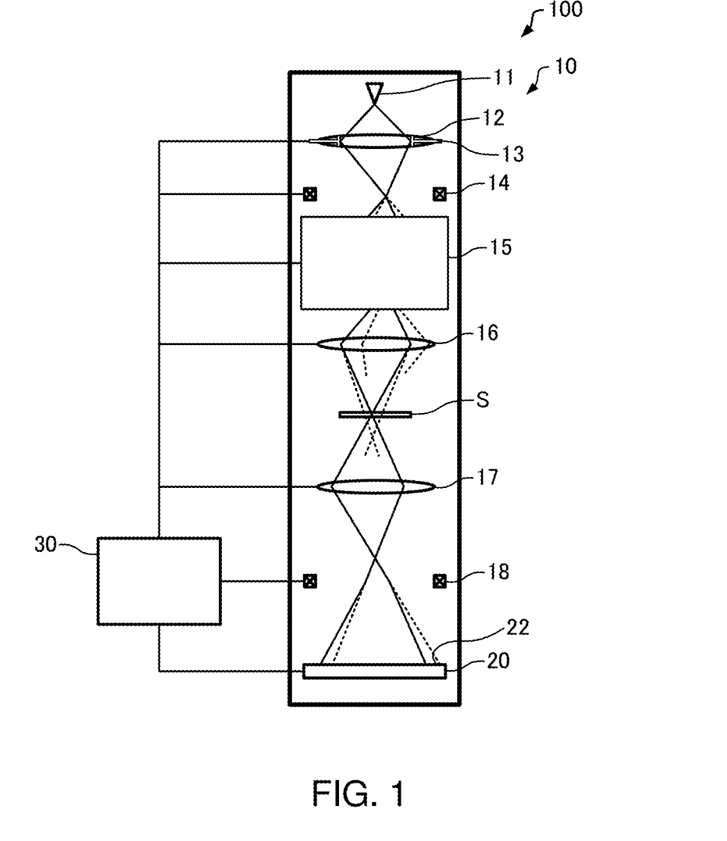
FIG. 1 is a diagram illustrating a configuration of a scanning transmission electron microscope according to an embodiment of the invention.

First, a scanning transmission electron microscope according to an embodiment of the invention will be described with reference to the drawings. FIG. 1 is a diagram illustrating a configuration of a scanning transmission electron microscope 100 according to the present embodiment.

The scanning transmission electron microscope 100 is an apparatus for scanning a specimen S with an electron probe and detecting electrons having been transmitted through the specimen S to obtain a scanned image (a scanning transmission electron microscope image, hereinafter also referred to as a "STEM image").

As illustrated in FIG. 1, the scanning transmission electron microscope 100 includes an optical system 10, an imaging device 20, and a control unit 30.

The optical system 10 includes an electron source 11, a condenser lens 12, a condenser aperture 13, an illumination system deflection element 14, an aberration corrector 15, an objective lens 16, an intermediate lens 17, and an imaging system deflection element 18.

The electron source 11 discharges an electron beam. The electron source 11 is, for example, an electron gun which accelerates electrons emitted from a cathode by an anode and which emits an electron beam. An accelerating voltage is applied between the cathode and the anode.

The condenser lens 12 focuses the electron beam emitted from the electron source 11. Although not illustrated, the condenser lens 12 may be constituted by a plurality of electron lenses.

The condenser aperture 13 is disposed inside the condenser lens 12. The condenser aperture 13 is a aperture for determining a divergence angle of an electron beam or a dose of the beam.

The aberration corrector 15 corrects an aberration of a probe-forming lens. The probe-forming lens is an optical system that is arranged before a specimen S. In the scanning transmission electron microscope 100, the condenser lens 12 and the objective lens 16 (an upstream-side magnetic field of the objective lens 16) function as the probe-forming lens. The probe-forming lens causes an electron beam to converge to form an electron probe.

The aberration corrector 15 is arranged between the condenser lens 12 and the objective lens 16. The aberration corrector 15 is, for example, a spherical aberration corrector that corrects a spherical aberration of the probe-forming lens. Alternatively, the aberration corrector 15 may be a chromatic aberration corrector that corrects a chromatic aberration.

The objective lens 16 focuses an electron beam to form an electron probe. An electron diffraction pattern, a Ronchigram, and the like are formed on a back focal plane of the objective lens 16.

In the scanning transmission electron microscope 100, the specimen S is arranged between the upstream-side magnetic field of the objective lens 16 and a downstream-side magnetic field of the objective lens 16. Although not illustrated, the scanning transmission electron microscope 100 includes a specimen stage and the specimen S is positioned by the specimen stage. The specimen stage has a moving mechanism which moves the specimen S in a height direction and a moving mechanism which moves the specimen S in a horizontal direction. The height direction of the specimen S is a direction along an optical axis of the optical system 10.

The intermediate lens 17 enlarges and transfers an electron diffraction pattern formed on the back focal plane of the objective lens 16.

Although not illustrated, the optical system 10 includes a scanning coil for scanning the specimen S with the electron probe. In addition, although not illustrated, the optical system 10 may include a plurality of illumination system deflection elements 14 and a plurality of imaging system deflection elements 18. It should be noted that the optical system 10 may include optical elements other than the lenses and apertures described above.

The imaging device 20 is arranged on the back focal plane of the objective lens 16 or a surface conjugate to the back focal plane of the objective lens 16. The imaging device 20 is capable of photographing a Ronchigram. For example, the imaging device 20 is a digital camera that is capable of recording a Ronchigram as a two-dimensional digital image.

A center of a detection surface 22 (a center of a sensor) of the imaging device 20 is positioned on, for example, the optical axis of the optical system 10. In addition, the center of the detection surface 22 of the imaging device 20 corresponds to a center of an image having been imaged by the imaging device 20.

Although not illustrated, the scanning transmission electron microscope 100 may include, as a detector for detecting electrons that are transmitted through the specimen S, an annular detector for acquiring a high-angle annular dark-field image (an HAADF-STEM image), a bright-field detector for detecting a bright-field STEM image, or the like.

The control unit 30 (a computer) controls each unit that constitutes the scanning transmission electron microscope 100. The control unit 30 controls the optical system 10. For example, the control unit 30 includes a processor such as a CPU (Central Processing Unit) and a storage device such as a RAM (Random Access Memory) and a ROM (Read Only Memory). The storage device stores programs for performing various kinds of control as well as data. Functions of the control unit 30 can be realized by having the processor execute the programs.

2. Adjustment Method of Optical System

Next, an adjustment method of the optical system 10 in the scanning transmission electron microscope 100 will be described. In the scanning transmission electron microscope 100, the control unit 30 adjusts the optical system 10. Hereinafter, an adjustment method of the optical system 10 for performing high-resolution observation in the scanning transmission electron microscope 100 will be described.

Figure 2:
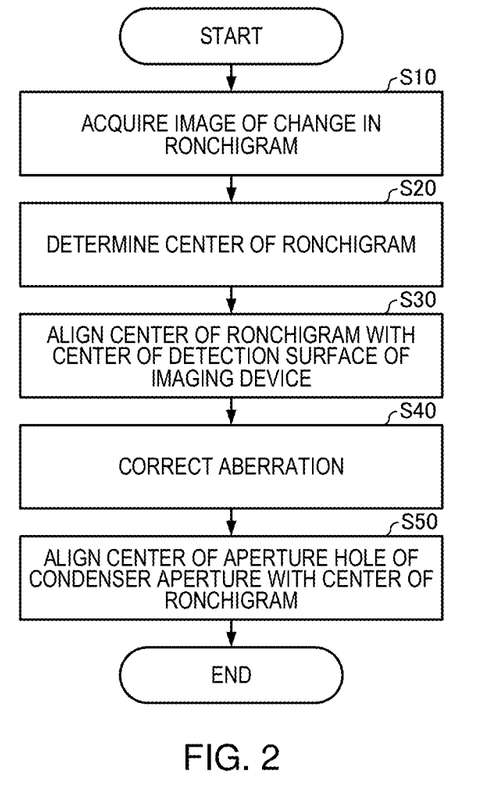
FIG. 2 is a flow chart illustrating an example of processing by a control unit of a scanning transmission electron microscope according to an embodiment of the invention.

FIG. 2 is a flow chart illustrating an example of processing by the control unit 30 of the scanning transmission electron microscope 100.

First, the control unit 30 acquires is an image of a change in a Ronchigram having been photographed by the imaging device 20 while changing excitation of the objective lens 16 (S10).

The control unit 30 maintains the imaging device 20 in an exposed state while changing the excitation of the objective lens 16. Accordingly, a situation of a change in the Ronchigram caused by a change in the excitation (a change in a defocus amount) of the objective lens 16 can be recorded in a single image. The image of the change in the Ronchigram is sent from the imaging device 20 to the control unit 30.

Next, the control unit 30 determines a center of the Ronchigram based on the acquired image of the change in the Ronchigram (S20). Processing for determining the center of the Ronchigram will be described in "3. Processing for Determining Center of Ronchigram" to be provided below.

Next, the control unit 30 causes the imaging system deflection element 18 to deflect an electron beam and aligns the center of the Ronchigram with a center of the detection surface 22 of the imaging device 20 (S30). A relationship between an excitation amount of the imaging system deflection element 18 and a movement amount of an electron beam has been calibrated in advance.

Next, the control unit 30 acquires a Ronchigram for aberration correction having been photographed by the imaging device 20, calculates an aberration based on the Ronchigram, and operates the aberration corrector 15 based on the calculated aberration (S40). As a result, an aberration of the optical system 10 is canceled by the aberration corrector 15 and the aberration is corrected. The control unit 30 calculates the aberration by assuming that the center of the detection surface 22 of the imaging device 20 is the center of the Ronchigram.

Next, the control unit 30 causes the illumination system deflection element 14 to deflect an electron beam and aligns a center of a aperture hole of the condenser aperture 13 with the center of the Ronchigram (S50).

For example, the aperture hole is specified from a shadow of the condenser aperture 13 and the illumination system deflection element 14 is caused to deflect an electron beam so that the center of the aperture hole is positioned at the center of the detector plane 22 of the imaging device 20. A relationship between an excitation amount of the illumination system deflection element 14 and a movement amount of an electron beam has been calibrated in advance.

Alternatively, the control unit 30 may align a center of a aperture hole of the condenser aperture 13 with the center of the Ronchigram by moving the condenser aperture 13.

Subsequently, the control unit 30 ends the processing of adjusting the optical system 10.

The processing described above enables the scanning transmission electron microscope 100 to observe a high-resolution STEM image.

3. Processing for Determining Center of Ronchigram

Figure 3:
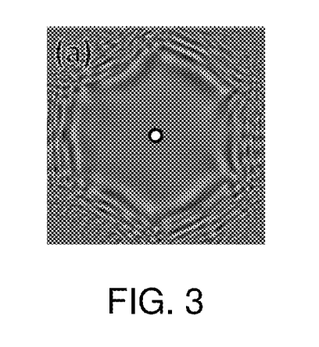
FIG. 3 is a diagram illustrating an example of a Ronchigram image.
Figure 4:
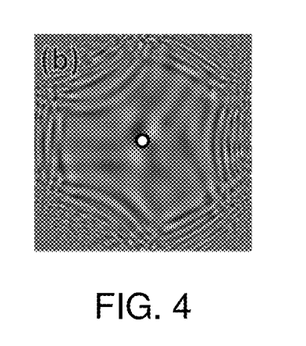
FIG. 4 is a diagram illustrating an example of a Ronchigram image.
Figure 5:
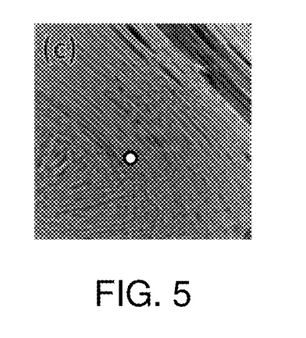
FIG. 5 is a diagram illustrating an example of a Ronchigram image.

FIGS. 3 to 5 are diagrams each illustrating an example of a Ronchigram image. It should be noted that FIG. 3 represents a Ronchigram image with hardly any aberration. FIG. 4 represents a Ronchigram image in a state where a three-fold astigmatism and a defocus are present. FIG. 5 represents a Ronchigram image in a state where a coma aberration, a two-fold astigmatism, and a defocus are present. It should be noted that the center of Ronchigrams are indicated by a dot in FIGS. 3 to 5.

A Ronchigram is a projected image of a specimen that is formed on a diffraction surface when a probe-forming lens focuses an electron beam near the specimen in a scanning transmission electron microscope. Optical characteristics (a degree of aberration) of an electron probe can be determined from the Ronchigram. The electron probe is a focal point where an electron beam is most focused. Scanning the specimen with the electron probe enables a STEM image to be obtained.

When calculating an aberration, a center of the Ronchigram must be determined.

As illustrated in FIGS. 3 and 4, when an aberration is hardly present or only a small amount of a specific aberration is present, the center of the Ronchigram can be intuitively determined by sight. However, as illustrated in FIG. 5, when there are a plurality of types of aberrations with low symmetry such as a coma aberration and an absolute value of the aberrations is large, it is difficult to intuitively determine the center of the Ronchigram by sight.

Figure 6:
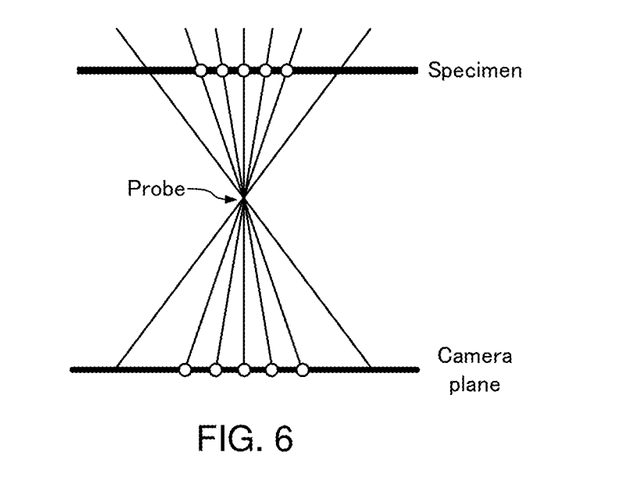
FIG. 6 is a diagram for explaining a relationship between relative positions of a specimen and an electron probe and a Ronchigram image.
Figure 7:
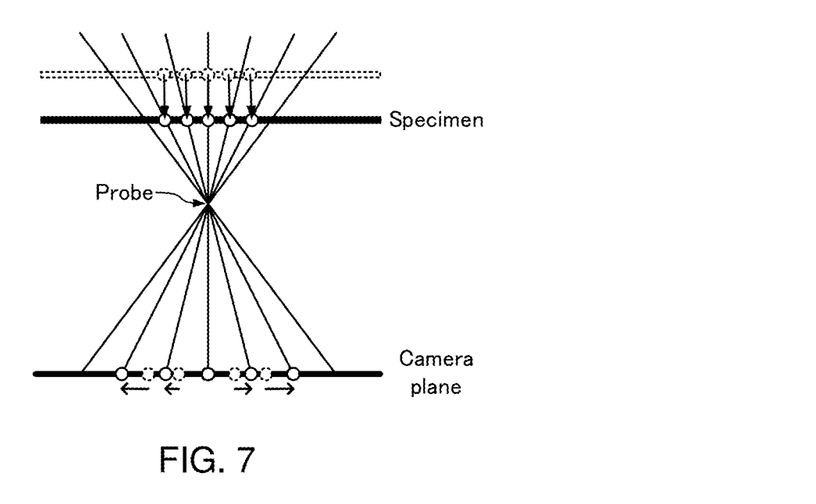
FIG. 7 is a diagram for explaining a relationship between relative positions of a specimen and an electron probe and a Ronchigram image.

FIGS. 6 and 7 are diagrams for explaining a relationship between relative positions of a specimen and an electron probe and a Ronchigram image. FIG. 6 illustrates how each point on a specimen is projected on a detection surface (a Camera plane) of the imaging device as a Ronchigram. FIG. 7 illustrates a situation of a change in the Ronchigram when the specimen is moved downward from the state illustrated in FIG. 6.

As illustrated in FIG. 7, when the specimen is moved downward, each point of the Ronchigram spreads in a radial pattern from the center of the Ronchigram that is an optical axis as a center.

As described above, since the Ronchigram is a projected image of the specimen, as illustrated in FIGS. 6 and 7, magnification can be changed by changing relative positions of the electron probe and the specimen. At this point, a center of a magnification change coincides with the center of the Ronchigram.

Figure 8:
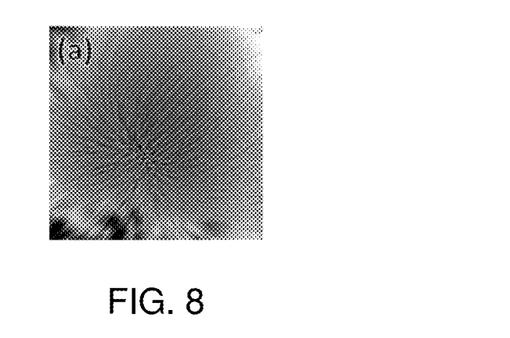
FIG. 8 is an image of a change in a Ronchigram having been photographed while changing excitation of an objective lens.

FIG. 8 is an image of a change in a Ronchigram having been photographed while changing excitation of the objective lens 16.

A Ronchigram image is photographed with the imaging device while changing excitation of the objective lens 16 (in other words, changing relative positions of the specimen and the electron probe) from the state illustrated in FIG. 5. In other words, a Ronchigram image is photographed with the imaging device while changing a defocus amount. As a result, an image of a change in a Ronchigram such as that illustrated in FIG. 8 is obtained. In the image of a change in a Ronchigram, a situation of a change in the Ronchigram due to a change in the relative positional relationship between the specimen and the electron probe is presented as illustrated in FIG. 8. It should be noted that the relative positional relationship between the specimen and the electron probe is a relative positional relationship between the specimen and the electron probe in a direction along the optical axis of the optical system 10 (in other words, a height direction of the specimen).

A pattern of radial straight lines illustrated in FIG. 8 is observed with the center of magnification change or, in other words, the center of the Ronchigram as a center of the pattern. Therefore, ideally, a point where the plurality of straight lines intersect each other coincides with the center of the Ronchigram. The radial pattern ideally appears in a case of an amorphous specimen such as a carbon film. FIG. 8 illustrates a pattern photographed using a specimen in which fine gold particles have been deposited on a carbon film.

Next, the center of the Ronchigram is determined based on the Ronchigram image including the radial pattern.

Figure 9:
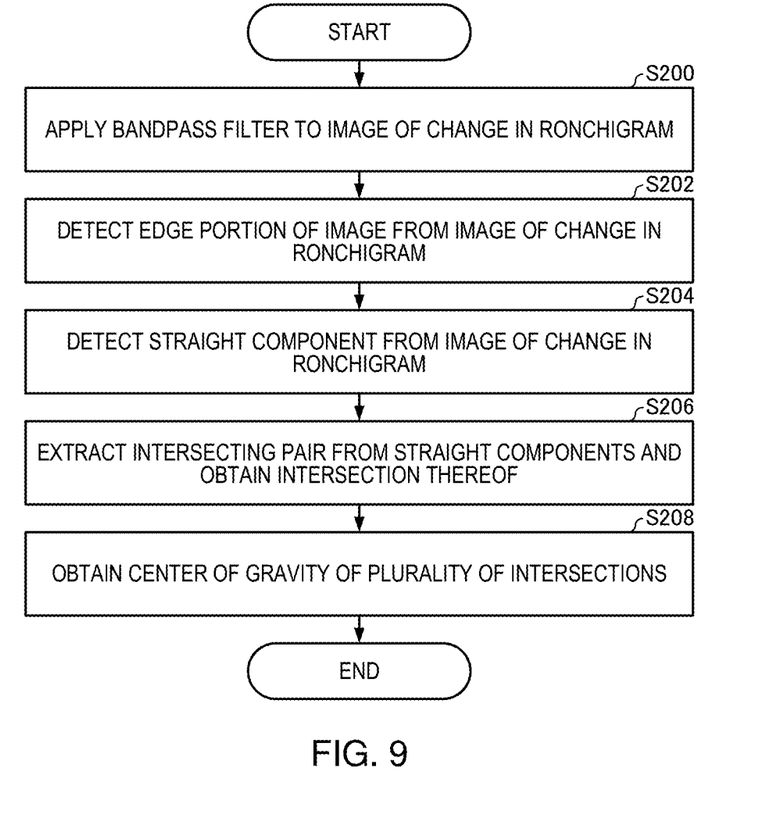
FIG. 9 is a flow chart illustrating an example of processing for determining a center of a Ronchigram from an image of a change in the Ronchigram.

FIG. 9 is a flow chart illustrating an example of processing for determining a center of a Ronchigram from an image of a change in the Ronchigram. FIGS. 10 to 13 are diagrams for explaining processing for determining a center of a Ronchigram from an image of a change in the Ronchigram.

Figure 10:
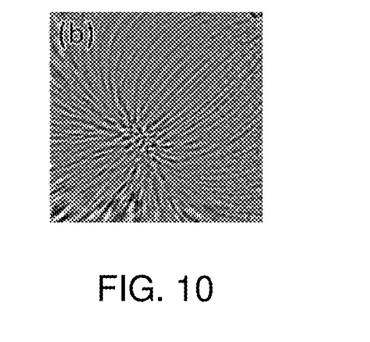
FIG. 10 is a diagram for explaining a processing for determining a center of a Ronchigram from an image of a change in the Ronchigram.

First, as illustrated in FIG. 10, a bandpass filter is applied to an image of a change in a Ronchigram (S200). As illustrated in FIG. 10, applying a bandpass filter to the image of a change in a Ronchigram enables a noise component that is included in the image of a change in a Ronchigram and a contrast in an uneven image that is derived from the specimen to be removed. The noise component is mainly a high-spatial frequency component. In addition, the contrast in an uneven image that is attributable to the specimen is mainly a low-spatial frequency component and a contrast that is derived from the fine gold particles.

Figure 11:
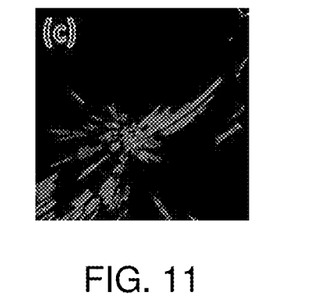
FIG. 11 is a diagram for explaining a processing for determining a center of a Ronchigram from an image of a change in the Ronchigram.

Next, as illustrated in FIG. 11, an edge portion of the image is extracted from the image of a change in a Ronchigram (S202). The processing of extracting an edge portion is performed by, for example, edge detection according to the Canny method. It should be noted that a method of extracting an edge portion is not particularly limited and known image processing can be used.

Figure 12:
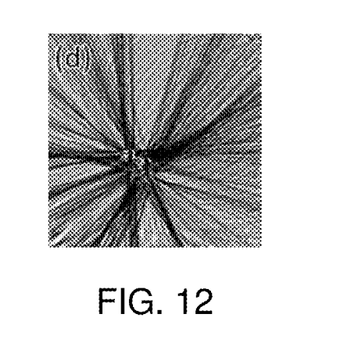
FIG. 12 is a diagram for explaining a processing for determining a center of a Ronchigram from an image of a change in the Ronchigram.

Next, as illustrated in FIG. 12, a straight component is detected from the image of a change in a Ronchigram from which the edge portion has been extracted (S204). The detection of a straight component is performed by, for example, a Hough transform. FIG. 12 illustrates the straight components detected by a Hough transform and an image after the bandpass filter illustrated in FIG. 10 has been applied being overlapped with each other.

It should be noted that a method of detecting the straight component is not particularly limited and known image processing can be used.

Next, a pair of straight components that intersect each other among the detected straight components are extracted in plurality and an intersection made by each pair is obtained (S206). For example, a pair in which an angle formed by the two intersecting straight lines is 89 degrees or more and 91 degrees or less is extracted as an intersecting pair. By extracting a pair (a perpendicular pair) that intersects at 90 degrees and a pair that intersects at an angle close to 90 degrees, the center of the Ronchigram can be determined with greater accuracy.

Selecting a pair in which an angle formed by the two intersecting straight lines is small when obtaining intersections of the detected straight components increases the possibility that an intersection is formed at a distant location from the center of the Ronchigram. Therefore, when selecting a pair, a pair in which the angle formed by the two straight lines is close to 90 degrees is selected.

Figure 13:
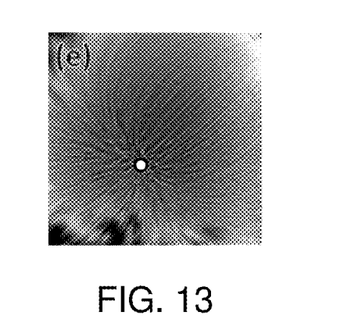
FIG. 13 is a diagram for explaining a processing for determining a center of a Ronchigram from an image of a change in the Ronchigram.

Next, a center of gravity of the plurality of obtained intersections is calculated (S208). A position of the center of gravity is adopted as a position of the center of the Ronchigram. In FIG. 13, the position of the center of gravity is indicated by a dot on the image of the change in a Ronchigram illustrated in FIG. 8.

Obtaining a plurality of intersections and adopting a position of a center of gravity of the intersections as a position of the center of the Ronchigram enables the position of the center of the Ronchigram to be determined with accuracy.

According to the processing described above, a center of a Ronchigram can be determined.

4. Operational Advantage

In the scanning transmission electron microscope 100, the control unit 30 performs processing for acquiring an image of a change in a Ronchigram in accordance with a change in a relative positional relationship between the specimen S and the electron probe and processing for determining a center of the Ronchigram based on the image of a change in the Ronchigram. In the scanning transmission electron microscope 100, the image of a change in the Ronchigram is an image of the Ronchigram having been photographed by the imaging device 20 while changing relative positions of the specimen S and the electron probe.

As described above, in the scanning transmission electron microscope 100, since the center of a Ronchigram is determined based on an image of a change in the Ronchigram, the center of the Ronchigram can be determined from an amorphous region included in a general specimen without having to prepare a specimen having a characteristic shape. Therefore, for example, the specimen need not be replaced in order to adjust the optical system 10.

In addition, in the scanning transmission electron microscope 100, since the center of a Ronchigram is determined based on an image of a change in the Ronchigram, the center of the Ronchigram can be determined by image processing even in a state where an optical axis has deviated significantly.

In the scanning transmission electron microscope 100, in the processing for determining a center of a Ronchigram, an intersection where straight components intersect each other is obtained in plurality from an image of a change in the Ronchigram and a center of the Ronchigram is determined based on the plurality of obtained intersections. Therefore, in the scanning transmission electron microscope 100, a center of a Ronchigram can be readily determined.

Furthermore, in the scanning transmission electron microscope 100, in the processing for determining a center of a Ronchigram, a center of gravity of the plurality of intersections is adopted as the center of the Ronchigram. Therefore, in the scanning transmission electron microscope 100, a position of a center of a Ronchigram can be accurately determined.

The scanning transmission electron microscope 100 includes the imaging system deflection element 18 that deflects an electron beam incident to the imaging device 20, and the control unit 30 performs processing for causing the imaging system deflection element 18 to deflect an electron beam and aligning the center of the Ronchigram with a center of the detection surface 22 of the imaging device 20. Therefore, in the scanning transmission electron microscope 100, the center of a Ronchigram can be readily aligned with the center of the detection surface 22 of the imaging device 20.

In the scanning transmission electron microscope 100, the optical system 10 includes the condenser aperture 13 and the illumination system deflection element 14 that deflects an electron beam having been transmitted through the condenser aperture 13, and the control unit 30 performs processing for causing the illumination system deflection element 14 to deflect an electron beam and aligning a center of the condenser aperture 13 with the center of the Ronchigram. As described above, in the scanning transmission electron microscope 100, since the control unit 30 positions the condenser aperture 13 by causing the illumination system deflection element 14 to deflect an electron beam, the condenser aperture 13 can be positioned more accurately than in a case where the condenser aperture 13 is positioned by mechanically moving the condenser aperture 13.

In the scanning transmission electron microscope 100, relative positions of the specimen S and the electron probe are changed by changing excitation of the objective lens 16. Therefore, in the scanning transmission electron microscope 100, a Ronchigram image for determining a position of a center of the Ronchigram can be readily acquired.

An adjustment method of the optical system 10 in the scanning transmission electron microscope 100 includes the steps of: acquiring an image of a change in a Ronchigram in accordance with a change in a relative positional relationship between the specimen S and the electron probe; and determining a center of the Ronchigram based on the image of a change in the Ronchigram. As a result, the center of the Ronchigram can be determined from an amorphous region included in a general specimen without having to prepare a specimen having a characteristic shape. Therefore, for example, the specimen need not be replaced in order to adjust the optical system 10.

5. Modifications

The invention is not limited to the above embodiment. Various modifications and variations may be made of the above embodiment without departing from the scope of the invention.

5.1. First Modification

For example, while the relative positions of the specimen S and the electron probe are changed by changing excitation of the objective lens 16 in the embodiment described above, the relative positions of the specimen S and the electron probe may be changed by changing an accelerating voltage that accelerates an electron beam. Even in this case, a similar operational advantage to that of the embodiment described above can be produced.

5.2. Second Modification

In addition, for example, the relative positions of the specimen S and the electron probe may be changed by changing a height of the specimen S. For example, the height of the specimen S can be changed by operating a specimen stage. Even in this case, a similar operational advantage to that of the embodiment described above can be produced.

5.3. Third Modification

Furthermore, for example, while an image of a change in a Ronchigram is acquired by photographing the Ronchigram while changing excitation of the objective lens 16 in the embodiment described above, for example, an image of a change in a Ronchigram may be acquired from a plurality of images of the Ronchigram acquired under different conditions with respect to the relative positional relationship between the specimen and the electron probe.

For example, first, a Ronchigram is photographed by setting the excitation of the objective lens 16 to an arbitrary excitation amount (a first excitation amount) and an image of a first Ronchigram is acquired. Next, a second Ronchigram is photographed by setting the excitation of the objective lens 16 to a second excitation amount that differs from the first excitation amount and a Ronchigram is acquired. Next, a Ronchigram is photographed by setting the excitation of the objective lens 16 to a third excitation amount that differs from both the first excitation amount and the second excitation amount and a third Ronchigram is acquired. The changing of the excitation amount of the objective lens 16 and the photography of a Ronchigram are repeated to acquire a plurality of Ronchigram images having been acquired under different conditions with respect to the relative positional relationship between the specimen and the electron probe. For example, the changing of the excitation amount of the objective lens 16 and the photography of a Ronchigram are repeated n-number of times to acquire first to n-th Ronchigram images.

Next, the plurality of acquired Ronchigram images (the first to n-th Ronchigram images) are integrated or averaged to generate a single image. Accordingly, an image of a change in the Ronchigram can be generated. It should be noted that "integration" means integrating intensities per pixel and generating a single image from a plurality of images and "averaging" means calculating an average intensity per pixel and generating a single image from a plurality of images.

Even with an image of a change in a Ronchigram acquired in this manner, the center of the Ronchigram can be determined by a similar method to the embodiment described above.

While a plurality of Ronchigram images having been acquired under different conditions with respect to the relative positional relationship between the specimen and the electron probe are acquired by repetitively changing the excitation amount of the objective lens 16 and photographing a Ronchigram, a plurality of Ronchigram images having been acquired under different conditions with respect to the relative positional relationship between the specimen and the electron probe may be acquired by repetitively changing an accelerating voltage and photographing a Ronchigram. Alternatively, a plurality of Ronchigram images having been acquired under different conditions with respect to the relative positional relationship between the specimen and the electron probe can be acquired by repetitively changing a height of the specimen S and photographing a Ronchigram.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A scanning transmission electron microscope that scans a specimen with an electron probe to acquire an image, the scanning transmission electron microscope comprising:
   an optical system which comprises a condenser lens and an objective lens;
   an imaging device which is arranged on a back focal plane or a plane conjugate to the back focal plane of the objective lens and which is configured to photograph a Ronchigram; and
   a control unit which performs adjustment of the optical system,
   the control unit configured or programmed to:
   acquire an image of a change in a Ronchigram that is: a) an image of a Ronchigram having been photographed by the imaging device which is maintained in an exposed state while changing relative positions of the specimen and the electron probe, or b) an image obtained by integrating or averaging a plurality of images of a Ronchigram having been acquired under different conditions with respect to a relative positional relationship between the specimen and the electron probe; and
   determine a center of the Ronchigram based on the image of the change in the Ronchigram.

2. The scanning transmission electron microscope according to claim 1, wherein
   an intersection where straight components intersect each other is obtained in plurality from the image of a change in a Ronchigram and the center of the Ronchigram is determined based on the plurality of obtained intersections.

3. The scanning transmission electron microscope according to claim 2, wherein
   the center of the Ronchigram is determined by adopting a center of gravity of the plurality of intersections as the center of the Ronchigram.

4. The scanning transmission electron microscope according to claim 1, further comprising
   an imaging system deflection element that deflects an electron beam incident to the imaging device, wherein
   the control unit is configured or programmed to cause the imaging system deflection element to deflect an electron beam and aligning the center of the Ronchigram with a center of a detection surface of the imaging device.

5. The scanning transmission electron microscope according to claim 1, wherein
   the optical system comprises a condenser aperture and an illumination system deflection element that deflects an electron beam having been transmitted through the condenser aperture, and
   the control unit is configured or programmed to cause the illumination system deflection element to deflect an electron beam and aligning a center of the condenser aperture with the center of the Ronchigram.

6. The scanning transmission electron microscope according to claim 1, wherein
   relative positions of the specimen and the electron probe are changed by changing excitation of the objective lens.

7. The scanning transmission electron microscope according to claim 1, wherein
   relative positions of the specimen and the electron probe are changed by changing an accelerating voltage that accelerates an electron beam.

8. The scanning transmission electron microscope according to claim 1, wherein
   relative positions of the specimen and the electron probe are changed by changing a height of the specimen.

9. The scanning transmission electron microscope according to claim 1, wherein
   the relative positional relationship between the specimen and the electron probe is a relative positional relationship between the specimen and the electron probe in a direction along an optical axis of the optical system.

10. An adjustment method of an optical system in a scanning transmission electron microscope, the scanning transmission electron microscope including: an optical system which includes a condenser lens and an objective lens; and an imaging device which is arranged on a back focal plane or a plane conjugate to the back focal plane of the objective lens and which is configured to photograph a Ronchigram, the scanning transmission electron microscope scanning a specimen with an electron probe to acquire an image, the adjustment method comprising:
    acquiring an image of a change in a Ronchigram that is: a) an image of a Ronchigram having been photographed by the imaging device which is maintained in an exposed state while changing relative positions of the specimen and the electron probe, or b) an image obtained by integrating or averaging a plurality of images of a Ronchigram having been acquired under different conditions with respect to a relative positional relationship between the specimen and the electron probe; and determining a center of the Ronchigram based on the image of the change in the Ronchigram.

* * * * *